(12) United States Patent
Huang et al.

(10) Patent No.: US 10,522,556 B1
(45) Date of Patent: Dec. 31, 2019

(54) ANTIFUSE STRUCTURE

(71) Applicant: NANYA TECHNOLOGY CORPORATION, New Taipei (TW)

(72) Inventors: Chin-Ling Huang, Taoyuan (TW); Chiang-Lin Shih, New Taipei (TW); Zi-Yin Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/034,905

(22) Filed: Jul. 13, 2018

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01)

(58) Field of Classification Search
CPC .................. H01L 27/11206; H01L 23/5252
USPC .......................................................... 257/530
See application file for complete search history.

(56) References Cited

U.S. PATENT DOCUMENTS

| | | | | |
|---|---|---|---|---|
| 7,598,541 | B2* | 10/2009 | Okamoto | H01L 21/823481 257/205 |
| 2003/0201514 | A1* | 10/2003 | Radens | H01L 23/5252 257/530 |
| 2004/0169207 | A1* | 9/2004 | Park | H01L 21/823437 257/250 |
| 2009/0189248 | A1* | 7/2009 | Kitamura | H01L 23/5252 257/530 |
| 2009/0206381 | A1* | 8/2009 | Shin | H01L 23/5254 257/300 |
| 2012/0182782 | A1* | 7/2012 | Kurjanowicz | G11C 17/16 365/94 |
| 2013/0062698 | A1* | 3/2013 | Agam | H01L 21/76 257/368 |
| 2014/0061802 | A1* | 3/2014 | Jang | H01L 23/5252 257/355 |
| 2017/0176793 | A1* | 6/2017 | Choi | H01L 29/41733 |

FOREIGN PATENT DOCUMENTS

| | | |
|---|---|---|
| TW | 201244049 A1 | 11/2012 |
| TW | 201628153 A | 8/2016 |
| TW | 201637021 A | 10/2016 |

* cited by examiner

*Primary Examiner* — Igwe U Anya
(74) *Attorney, Agent, or Firm* — Muncy, Geissler, Olds & Lowe, P.C.

(57) ABSTRACT

An antifuse structure includes an active area and a gate electrode over the active area. The active area includes a first body portion and a first extending portion extending in a first direction. The gate electrode includes a second body portion and a second extending portion extending in a second direction perpendicular to the first direction. The first body portion includes a first surface facing a portion of the second body portion, and the second body portion includes a second surface facing a portion of the first extending portion. The first extending portion and the second extending portion are partially overlapped in a third direction perpendicular to both the first direction and the second direction, with a dielectric layer sandwiched between the first and second extending portions, forming an intersection area.

9 Claims, 6 Drawing Sheets

ANTIFUSE STRUCTURE

TECHNICAL FIELD

The present disclosure relates to an antifuse structure, and more particularly, to a gate oxide (GOX) antifuse structure.

DISCUSSION OF THE BACKGROUND

In integration circuit fabrication, the antifuse and the fuse are widely used for fault tolerance. For example, the antifuse and the fuse may be placed in circuit paths in a device. An originally conductible circuit path may be broken or become an open circuit by blowing a fuse. In contrast, an originally unconductible circuit path may become a short circuit by blowing an antifuse. In addition, the antifuse is also used for one-time programming.

One type of antifuse structure is comprised of two conductors separated from each other by an insulator. The two conductors are separately connected to different components. The path between the two conductors is an unconductible circuit path, i.e., an open circuit, when the applied voltage is lower than a programming voltage. When the programming voltage is applied, the insulator undergoes a dielectric breakdown process. A leakage current increases and a thermal runaway condition develops, melting the insulator and adjacent conductive materials. The conductive materials flow from the two conductors and form a conductive filament, resulting in a short circuit between the two conductors.

The programming voltage is a critical factor in the design rule of the antifuse, and the present disclosure provides an antifuse structure which may be programmed with an appropriate programming voltage.

This Discussion of the Background section is for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides an antifuse structure. The antifuse structure includes an active area and a gate electrode over the active area. The active area includes a first body portion and a first extending portion extending in a first direction. The gate electrode includes a second body portion and a second extending portion extending in a second direction perpendicular to the first direction. The first body portion includes a first surface facing a portion of the second body portion, and the second body portion includes a second surface facing a portion of the first extending portion. The first extending portion and the second extending portion are partially overlapped in a third direction perpendicular to both the first direction and the second direction, with a dielectric layer sandwiched between the first and second extending portions, forming an intersection area.

In some embodiments, the intersection area has an aspect ratio in a range of from about 0.9 to 1.5.

In some embodiments, the first surface is separated from the gate electrode in the first direction.

In some embodiments, the antifuse structure further includes a first conductive via disposed on the first body portion. The first conductive via electrically connects to the active area. The antifuse structure further includes a second conductive via disposed on the second body portion. The second conductive via electrically connects to the gate electrode.

One aspect of the present disclosure provides an antifuse structure. The antifuse structure includes an active area and a gate electrode over the active area. The active area includes a first body portion and a first extending portion extending in a first direction. The gate electrode includes a second body portion and two second extending portions extending from the second body portion in the first direction and separated from each other by a space. The first extending portion and the second body portion are partially overlapped in a vertical projection direction perpendicular to the first direction, with a dielectric layer sandwiched between the first extending portion and the second body portion, forming an intersection area.

In some embodiments, the intersection area has an aspect ratio in a range of from about 0.9 to 1.5.

In some embodiments, the first surface is separated from the gate electrode in the first direction.

In some embodiments, the antifuse structure further includes a first conductive via disposed on the first body portion. The first conductive via electrically connects to the active area.

In some embodiments, the first extending portion extends beyond the second body portion and protrudes from the space, and a portion of the first extending portion is positioned between the two second extending portions when viewed from the vertical projection direction.

In some embodiments, the two second extending portions extend farther from the second body portion than the first extending portion.

In some embodiments, the gate electrode includes a third body portion, and the two second extending portions extend between the second body portion and the third body portion.

In some embodiments, the antifuse structure further includes a second conductive via disposed on the third body portion. The second conductive via electrically connects to the gate electrode.

In some embodiments, the first extending portion includes a protruding surface facing the third body portion.

In some embodiments, the two second extending portions have an extending portion width and the space has a space width greater than the extending portion width.

In some embodiments, the first extending portion has a width greater than the extending portion width and less than the space width.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1A:
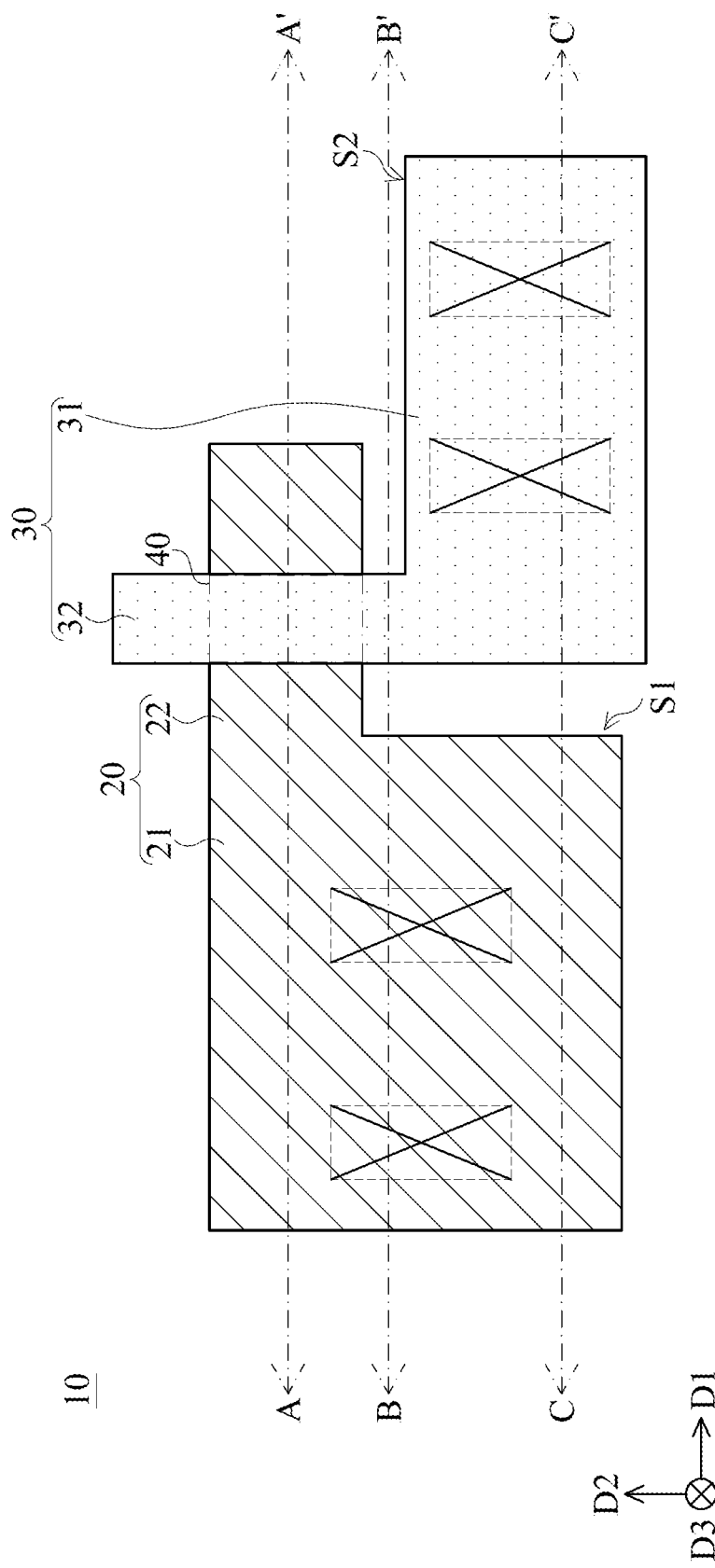
FIG. 1A is a schematic top view illustrating an antifuse structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Referring to FIG. 1A, FIG. 1A is a schematic top view illustrating an antifuse structure 10 in accordance with some embodiments of the present disclosure. The antifuse structure 10 includes an active area 20 and a gate electrode 30 above the active area 20.

The active area 20 includes a doped region. For example, the active area 20 is formed in a semiconductor substrate 35 (see FIG. 1B) and is proximal to a surface of the semiconductor substrate 35. The active area 20 may contain a higher dopant concentration than other portions of the semiconductor substrate 35. The dopant concentration, type, and range or other critical factors may be adjusted for controlling the characteristics of a channel which is to be formed between the active area 20 and the gate electrode 30 after the antifuse structure 10 is fused or blown.

The material of the gate electrode 30 may include doped semiconductor material such as doped polycrystalline silicon. The active area 20 and the gate electrode 30 may have the same dopant type. The gate electrode 30 may be formed on a gate oxide (such as the dielectric layer 50 in FIG. 1B) over the semiconductor substrate 35.

Still referring to FIG. 1A, the active area 20 includes a first body portion 21 and a first extending portion 22 extending in a first direction D1. The gate electrode 30 includes a second body portion 31 and a second extending portion 32 extending in a second direction D2 perpendicular to the first direction D1.

In some embodiments of the present disclosure, the first body portion 21 is substantially rectangular as viewed from a third direction D3 (the vertical projection direction). The first extending portion 22 extends from the first body portion 21 along with a long side of the first body portion 21. In some embodiments of the present disclosure, a side of the first body portion 21 and a side of the first extending portion 22 are coplanar. In some embodiments of the present disclosure, the first extending portion 22 is substantially rectangular as viewed from the third direction D3.

In some embodiments of the present disclosure, the second body portion 31 is substantially rectangular as viewed from a third direction D3 (the vertical projection direction). The second extending portion 32 extends from the second body portion 31 along with a long side of second body portion 31. In some embodiments of the present disclosure, a side of second body portion 31 and a side of the second extending portion 32 are coplanar. In some embodiments of the present disclosure, the second extending portion 32 is substantially rectangular as viewed from the third direction D3.

In some embodiments of the present disclosure, the first body portion 21 includes a first surface S1 facing a portion of the second body portion 31, and the second body portion 31 includes a second surface S2 facing a portion of the first extending portion 22.

In some embodiments of the present disclosure, a normal vector of the first surface S1 is directed in the first direction D1 toward the second body portion 31. In some embodiments of the present disclosure, a normal vector of the second surface S2 is directed in the second direction D2 toward the first extending portion 22.

In some embodiments of the present disclosure, the first extending portion 22 extends along the normal vector of the first surface S1 from the first body portion 21. In some embodiments of the present disclosure, the second extending portion 32 extends along the normal vector of the second surface S2 from the second body portion 31.

Figure 2A:
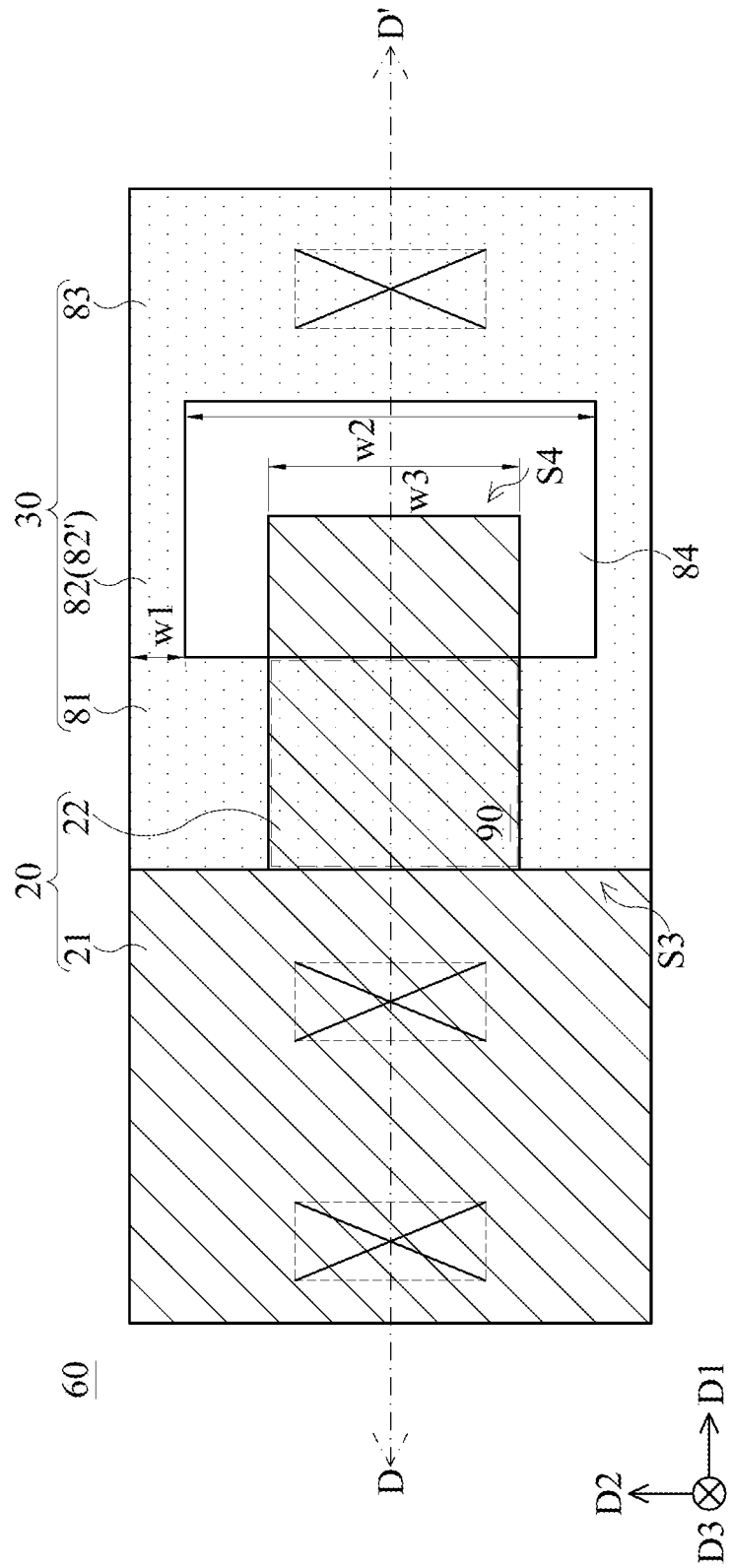
FIG. 2A is a schematic top view illustrating an antifuse structure in accordance with a comparative embodiment of the present disclosure.

In some embodiments of the present disclosure, the first surface S1 is separated from the gate electrode 30 when viewed from the first direction D1 as shown in FIG. 1A. In some embodiments of the present disclosure, an edge surface S3 of the gate electrode 30 is proximate to the active area 20 when viewed from the first direction D1 as shown in FIG. 2A.

In some embodiments of the present disclosure, the first extending portion 22 and the second extending portion 32 are partially overlapped in the third direction D3 perpendicular to both the first direction D1 and the second direction D2, with a dielectric layer (further discussed with respect to FIG. 1B) sandwiched between the first extending portion 22 and the second extending portion 32. The first extending portion 22 and the second extending portion 32 are partially overlapped and form an intersection area 40.

In some embodiments of the present disclosure, the intersection area 40 has an aspect ratio in a range of from about 0.9 to 1.5.

It is accepted that the dimension of the intersection area 40 is crucial to the programming voltage for fusing the antifuse structure 10. In other words, a greater intersection area 40 corresponds to a higher programming voltage. There is an appropriate range of the programming voltage. The antifuse structure 10 needs to sustain the normal voltage without fusing, and too low of a programming voltage must not be allowed to fuse the antifuse structure 10. On the other hand, the antifuse structure 10 must be configured to be fused when the applied voltage meets the required value, and too high of a programming voltage may lead to functional incapacitation of the antifuse structure 10.

If the aspect ratio of the intersection area 40 is less than about 0.9, the intersection area 40 is not great enough to sustain the normal voltage before the antifuse is fused. If the aspect ratio of the intersection area 40 is greater than about 1.5, the intersection area 40 may be too great to be properly fused at a suitable voltage.

Figure 1B:
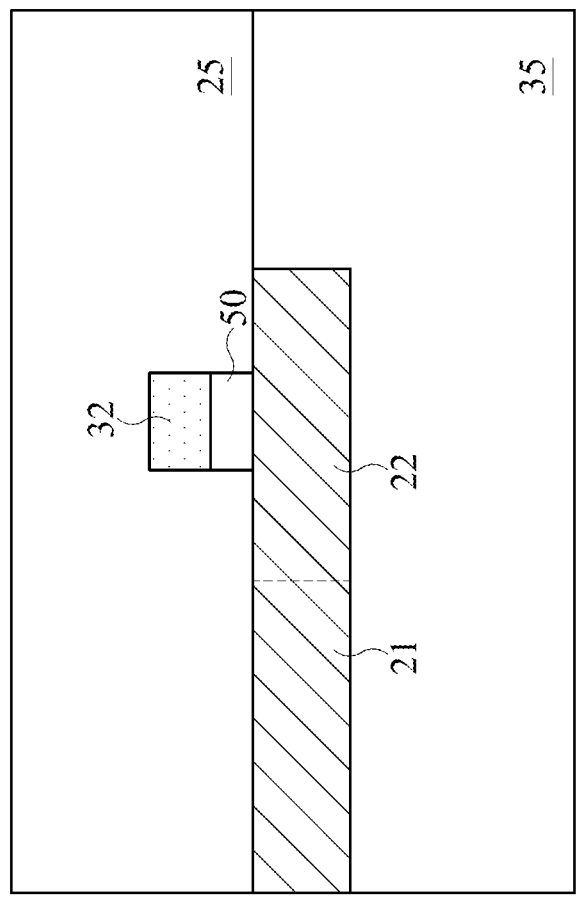
FIG. 1B is a schematic cross-sectional view illustrating an antifuse structure along a line A-A' of FIG. 1A in accordance with some embodiments of the present disclosure.

Referring to FIG. 1B, FIG. 1B is a schematic cross-sectional view of an antifuse structure along a line A-A' of FIG. 1A in accordance with some embodiments of the present disclosure.

The first extending portion 22 and the second extending portion 32 are overlapped in a third direction D3 with the dielectric layer 50 sandwiched between the first extending portion 22 and the second extending portion 32.

In some embodiments of the present disclosure, the dielectric layer 50 includes a gate oxide. With the gate oxide isolating the first extending portion 22 from the second extending portion 32, the path between the first extending portion 22 and the second extending portion 32 remains open unless the programming voltage is applied.

In some embodiments of the present disclosure, the dielectric layer 50 directly contacts the second extending portion 32. In some embodiments of the present disclosure, a top view area of the dielectric layer 50 is substantially equal to a top view area of the second extending portion 32.

In some embodiments of the present disclosure, the dielectric layer 50 is recessed in the semiconductor substrate 35. In some embodiments of the present disclosure, the dielectric layer 50 directly contacts the first extending portion 22.

In some embodiments of the present disclosure, an insulating layer 25 covers the active area 20 and the gate electrode 30. In some embodiments of the present disclosure, the gate electrode 30 is recessed in the insulating layer 25 and is proximate to a surface of the insulating layer 25.

In some embodiments of the present disclosure, the insulating layer 25 has a common surface with the semiconductor substrate 35, and the active area 20 and the gate electrode 30 are both proximate to the common surface.

Figure 1C:
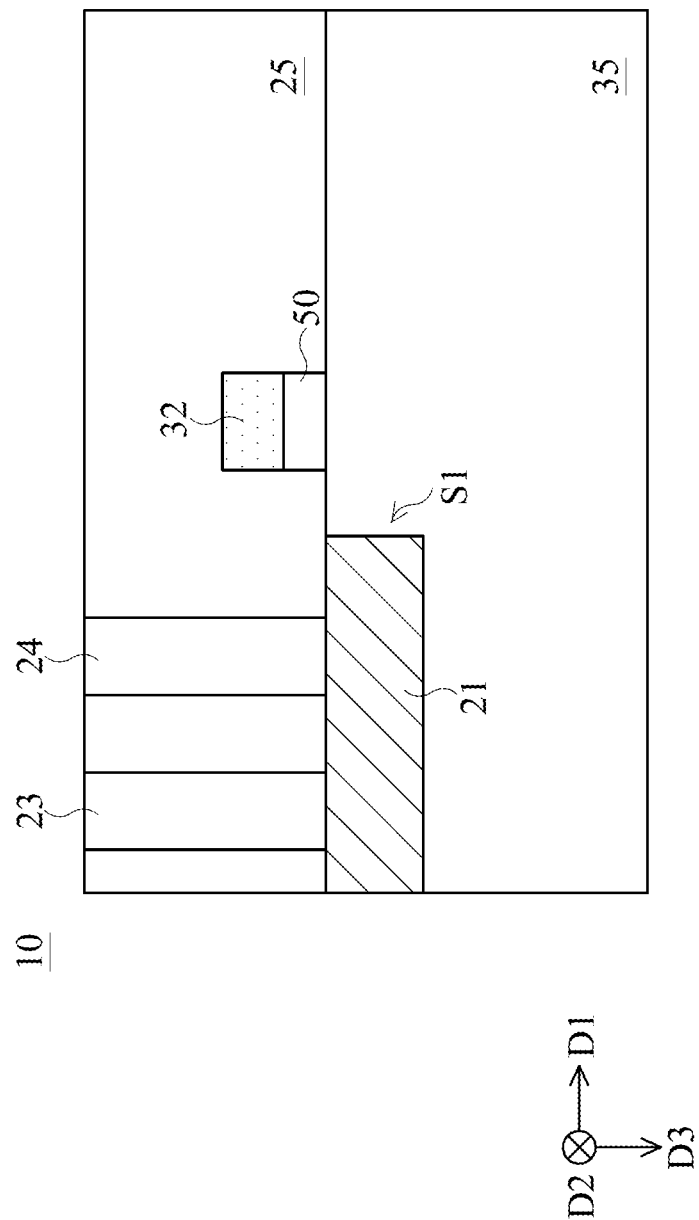
FIG. 1C is a schematic cross-sectional view illustrating an antifuse structure along a line B-B' of FIG. 1A in accordance with some embodiments of the present disclosure.

Referring to FIG. 1C, FIG. 1C is a schematic cross-sectional view illustrating an antifuse structure along a line B-B' of FIG. 1A in accordance with some embodiments of the present disclosure.

As shown in FIG. 1C, in some embodiments of the present disclosure, a first conductive via 23 is formed on the first body portion 21 and electrically connects to the active area 20.

In some embodiments of the present disclosure, the first conductive via 23 extends through the thickness of the insulating layer 25 and connects to a conductor, such as a signal line for applying the programming voltage.

In some embodiments of the present disclosure, another conductive via 24 is formed on the first body portion 21 and electrically connects to the active area 20.

Although two conductive vias are illustrated in FIG. 1C for simplicity of explanation, any number of the conductive vias may be formed, as will be apparent to one of ordinary skill in the art upon consideration of the present disclosure.

Although two conductive vias extend through the thickness of the insulating layer 25 as illustrated in FIG. 1C, the conductive vias may extend through the thickness of the semiconductor substrate 35, as will be apparent to one of ordinary skill in the art upon consideration of the present disclosure.

Figure 1D:
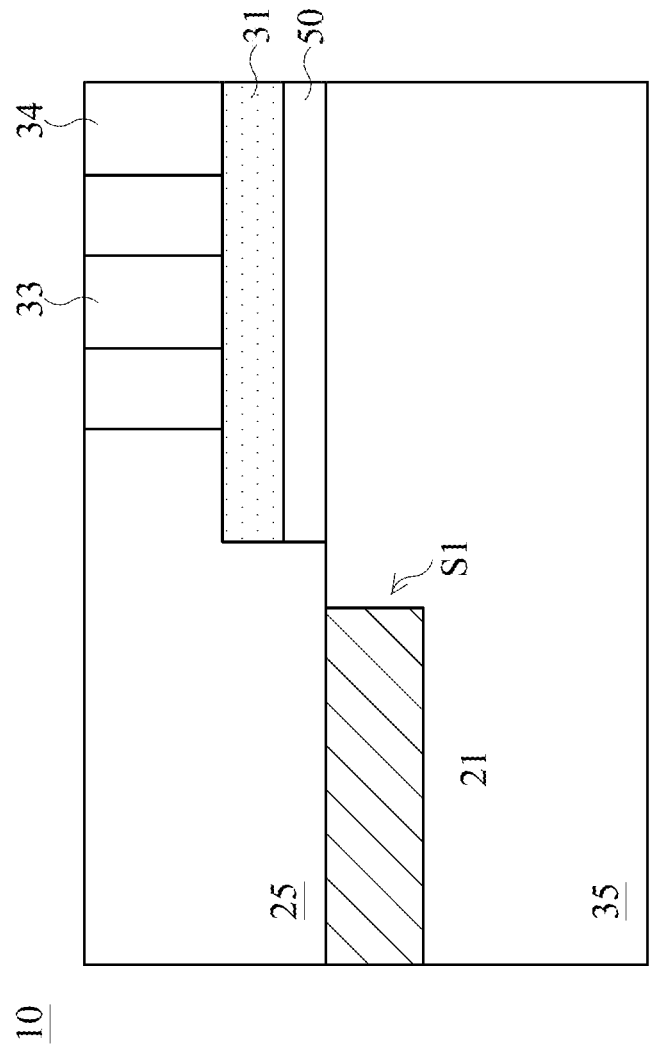
FIG. 1D is a schematic cross-sectional view illustrating an antifuse structure along a line C-C' of FIG. 1A in accordance with some embodiments of the present disclosure.

Referring to FIG. 1D, FIG. 1D is a schematic cross-sectional view illustrating an antifuse structure along a line C-C' of FIG. 1A in accordance with some embodiments of the present disclosure.

As shown in FIG. 1D, in some embodiments of the present disclosure, a second conductive via 33 is formed on the second body portion 31 and electrically connects to the gate electrode 30.

In some embodiments of the present disclosure, the second conductive via 33 extends through the thickness of the semiconductor substrate 35 and connects to a conductor, such as a signal line for applying the programming voltage. As mentioned above, the second conductive via 33 may extend through the thickness of the insulating layer 25.

In some embodiments of the present disclosure, another conductive via 34 is formed. As mentioned above, any number of the conductive vias may be formed.

The antifuse structure 10 remains open until the programming voltage is applied through the conductive vias 23, 24, 33 or 34. When the programming voltage is applied, the dielectric layer 50 undergoes a dielectric breakdown process. A leakage current increases and a thermal runaway condition develops, melting the dielectric layer 50 and adjacent conductive materials (such as the active area 20 and the gate electrode 30). The conductive materials flow from the two conductors and form a conductive filament or a channel, resulting a short circuit between two conductors.

Referring to FIG. 2A, FIG. 2A is a schematic top view illustrating an antifuse structure 60 in accordance with a comparative embodiment of the present disclosure.

The antifuse structure 60 is similar to the antifuse structure 10, and the identical numbers represent similar components for simplicity of explanation. Such similar components are omitted from the description in the interest of brevity, and only the differences are described.

The antifuse structure 60 includes the active area 20 and the gate electrode 30 above the active area 20. The active area 20 includes the first body portion 21 and the first extending portion 22 extending in the first direction D1.

As shown in FIG. 2A, a line of symmetry of the first extending portion 22 is aligned with a line of symmetry of the first body portion 21.

Still referring to FIG. 2A, the gate electrode 30 includes a second body portion 81 and two second extending portions 82 and 82' extending from the second body portion 81 in the first direction D1 and separated from each other by a space 84.

In some embodiments of the present disclosure, the second body portion 81 includes an edge surface S3 opposite to the surface from which the two second extending portions 82 and 82' extend. In some embodiments of the present disclosure, the edge surface S3 is proximate to the first body portion 21 in the first direction D1.

The two second extending portions 82 and 82' extend from the second body portion 81 along a normal vector of the edge surface S3. The two second extending portions 82 and 82' extend from the second body portion 81 in a direction away from the edge surface S3.

In some embodiments of the present disclosure, the two second extending portions 82 and 82' have an extending portion width w1 and the space 84 has a space width w2 greater than the extending portion width w1.

In some embodiments of the present disclosure, a surface of one of the two second extending portions 82 and 82' is aligned with a surface of the first body portion 21.

When the antifuse structure 60 is fused, and the circuit path between the active area 20 and the gate electrode 30 is conductible, the electric current is separated into two paths, that is, the two second extending portions 82 and 82'.

In some embodiments of the present disclosure, the first extending portion 22 has a width w3 greater than the extending portion width w1 and less than the space width w2.

Still referring to FIG. 2A, the first extending portion 22 and the second body portion 81 are partially overlapped in the third direction D3 (the vertical projection direction), with a dielectric layer 50 (see FIG. 2B) sandwiched between the first extending portion 22 and the second body portion 81, forming an intersection area 90.

In some embodiments of the present disclosure, the intersection area 90 has an aspect ratio in a range of from about 0.9 to 1.5.

In some embodiments of the present disclosure, the first extending portion 22 extends beyond the second body portion 81 and protrudes from the space 84, and a portion of the first extending portion 22 appears between the two second extending portions 82 and 82' when viewed from the third direction D3.

In some embodiments of the present disclosure, the two second extending portions 82 and 82' extend farther from the second body portion 81 than from the first extending portion 22.

In some embodiments of the present disclosure, the gate electrode 30 further includes a third body portion 83, wherein the two second extending portions 82 and 82' extend between the second body portion 81 and the third body portion 83. In some embodiments of the present disclosure, the two second extending portions 82 and 82' connect to both the second body portion 81 and the third body portion 83. In some embodiments of the present disclosure, the two second extending portions 82 and 82', the second body portion 81, and the third body portion 83 together encircle the space 84.

In some embodiments of the present disclosure, the first extending portion 22 includes a protruding surface S4 facing the third body portion 83. In some embodiments of the present disclosure, the protruding surface S4 is in the space 84 and surrounded by the two second extending portions 82 and 82', the second body portion 81, and the third body portion 83 when viewed from the third direction D3.

Figure 2B:
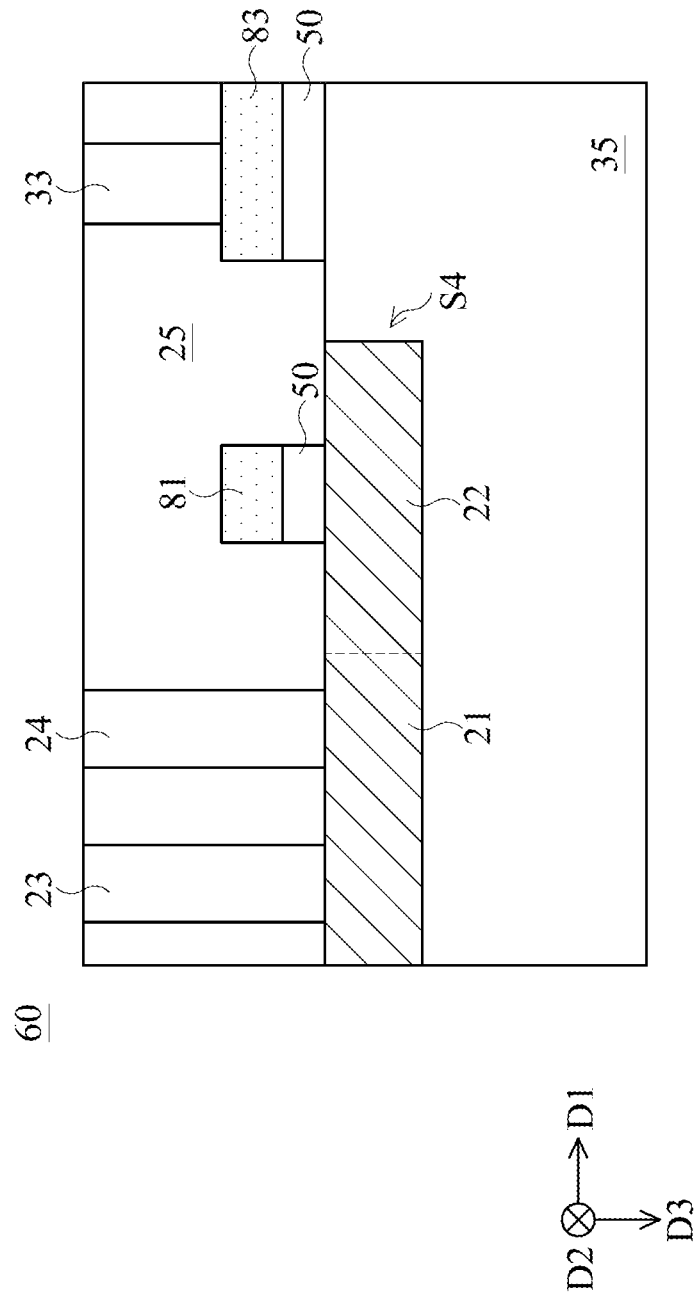
FIG. 2B is a schematic cross-sectional view illustrating an antifuse structure along a line D-D' of FIG. 2A in accordance with some embodiments of the present disclosure.

Referring to FIG. 2B, FIG. 2B is a schematic cross-sectional view illustrating an antifuse structure along a line D-D' of FIG. 2A in accordance with some embodiments of the present disclosure.

In some embodiments of the present disclosure, the antifuse structure 60 includes a first conductive via 23 formed on the first body portion 21, electrically connecting to the active area 20.

In some embodiments of the present disclosure, another conductive via 24 is formed on the first body portion 21 and electrically connects to the active area 20.

In some embodiments of the present disclosure, the antifuse structure 60 includes a second conductive via 33 formed on the third body portion 83, electrically connecting to the gate electrode 30.

One aspect of the present disclosure provides an antifuse structure. The antifuse structure includes an active area and a gate electrode over the active area. The active area includes a first body portion and a first extending portion extending in a first direction. The gate electrode includes a second body portion and a second extending portion extending in a second direction perpendicular to the first direction. The first body portion includes a first surface facing a portion of the second body portion, and the second body portion includes a second surface facing a portion of the first extending portion. The first extending portion and the second extending portion are partially overlapped in a third direction perpendicular to both the first direction and the second direction, with a dielectric layer sandwiched between the first and second extending portions, forming an intersection area.

One aspect of the present disclosure provides an antifuse structure. The antifuse structure includes an active area and a gate electrode over the active area. The active area includes a first body portion and a first extending portion extending in a first direction. The gate electrode includes a second body portion and two second extending portions extending from the second body portion in the first direction and separated from each other by a space. The first extending portion and the second body portion are partially overlapped in a vertical projection direction perpendicular to the first direction, with a dielectric layer sandwiched between the first extending portion and the second body portion, forming an intersection area.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An antifuse structure, comprising:

an active area having a first body portion and a first extending portion extending in a first direction; and a gate electrode over the active area, wherein the gate electrode includes a second body portion and two second extending portions extending from the second body portion in the first direction, and the second body portion and two second extending portions are separated from each other by a space;

wherein the first extending portion and the second body portion are partially overlapped in a vertical projection direction perpendicular to the first direction, with a dielectric layer sandwiched between the first extending portion and the second body portion, forming an intersection area;

wherein the first extending portion extends beyond the second body portion and protrudes from the space, and a portion of the first extending portion appears between the two second extending portions when viewed from the vertical projection direction;

wherein the two second extending portions extend farther from the second body portion than from the first extending portion.

2. The antifuse structure of claim 1, wherein the intersection area has an aspect ratio in a range of from about 0.9 to 1.5.

3. The antifuse structure of claim 1, wherein the second body portion includes an edge surface opposite to the surface from which the two second extending portion extend, and wherein the edge surface is proximate to the first body portion in the first direction.

4. The antifuse structure of claim 1, further comprising:

a first conductive via disposed on the first body portion, electrically connecting to the active area.

5. The antifuse structure of claim 1, wherein the gate electrode includes a third body portion, and the two second extending portions extend between the second body portion and the third body portion.

6. The antifuse structure of claim 5, further comprising:

a second conductive via disposed on the third body portion, electrically connecting to the gate electrode.

7. The antifuse structure of claim 5, wherein the first extending portion includes a protruding surface facing the third body portion.

8. An antifuse structure comprising:

an active area having a first body portion and a first extending portion extending in a first direction; and a gate electrode over the active area, wherein the gate electrode includes a second body portion and two second extending portions extending from the second body portion in the first direction, and the second body portion and two second extending portions are separated from each other by a space;

wherein the first extending portion and the second body portion are partially overlapped in a vertical projection direction perpendicular to the first direction, with a dielectric layer sandwiched between the first extending portion and the second body portion, forming an intersection area;

wherein the two second extending portions have an extending portion width and the space has a space width greater than the extending portion width.

9. The antifuse structure of claim 8, wherein the first extending portion has a width greater than the extending portion width and less than the space width.

* * * * *